United States Patent [19]
Hofmann et al.

[11] Patent Number: 4,791,017
[45] Date of Patent: Dec. 13, 1988

[54] HARD, GOLD-COLORED UNDER LAYER FOR A GOLD OR GOLD-CONTAINING SURFACE LAYER AND AN ARTICLE THEREWITH

[75] Inventors: Dieter Hofmann, Bruchköbel; Klaus-Jürgen Heimbach, Hattersheim; Helmut Petersein, Gelnhausen-Höchst; Wolf-Dieter Münz, Somborn, all of Fed. Rep. of Germany

[73] Assignee: Leybold-Heraeus GmbH, Cologne, Fed. Rep. of Germany

[21] Appl. No.: 947,991

[22] Filed: Dec. 31, 1986

Related U.S. Application Data

[63] Continuation-in-part of Ser. No. 762,556, Aug. 5, 1985, abandoned.

[30] Foreign Application Priority Data

Aug. 6, 1984 [DE] Fed. Rep. of Germany ....... 3428951

[51] Int. Cl.$^4$ .......................... B32B 7/02; B32B 15/04
[52] U.S. Cl. .................................... 428/216; 428/336; 428/469; 428/698; 428/699; 428/704

[58] Field of Search ............... 428/698, 699, 627, 457, 428/216, 336, 704, 469

[56] References Cited

U.S. PATENT DOCUMENTS 4,455,351  6/1984  Camlibel et al. ............... 428/698 X

FOREIGN PATENT DOCUMENTS 2000812  1/1979  United Kingdom ................ 428/698

Primary Examiner—Thomas J. Herbert
Attorney, Agent, or Firm—Felfe & Lynch

[57] ABSTRACT

An underlayer of at least one a carbonitride of titanium, zirconium, hafnium or vanadium or hafnium nitride may be under a surface layer at least containing gold or on a still-undermore decorative article, and preferably both. It has a brilliance approximating that of gold so that, when appropriately color matched to the surface layer, it disguises spots of the surface layer worn away in use of the article. The underlayer and surface layer may be deposited in a cathode vaporization process from corresponding metallic cathode targets in appropriate neutral or reactive atmospheres.

15 Claims, 4 Drawing Sheets

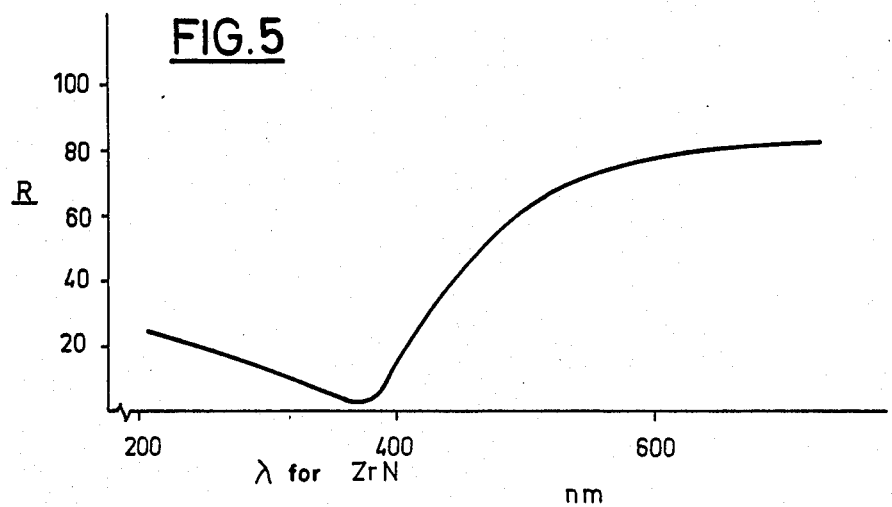
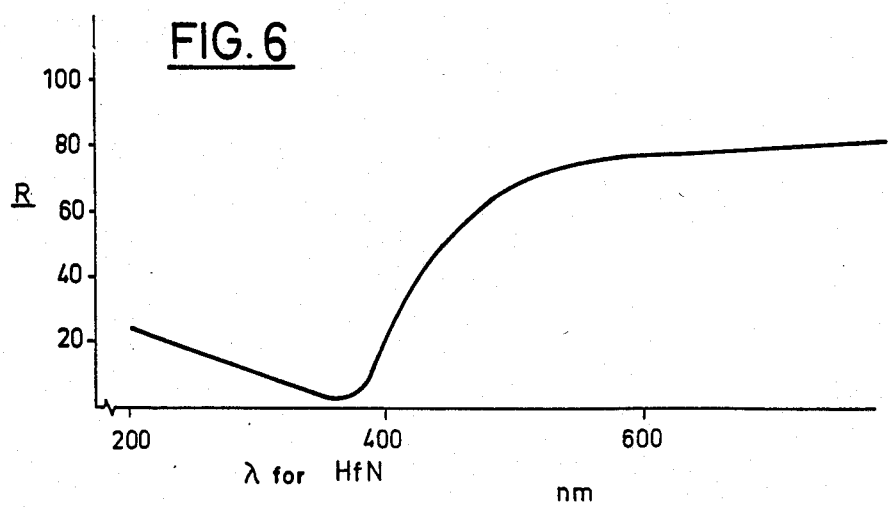

HARD, GOLD-COLORED UNDER LAYER FOR A GOLD OR GOLD-CONTAINING SURFACE LAYER AND AN ARTICLE THEREWITH

This is a continuation-in-part of pending prior application Ser. No. 762,556, filed Aug. 5, 1985, now abandoned.

BACKGROUND OF THE INVENTION

This invention relates to a hard, gold-colored underlayer for a gold or gold-containing surface layer, and article therewith.

Decorative articles such as writing implements, cigarette lighters, spectacle frames, watch cases and straps, and ornaments of all types having a gold or gold-containing surface layer are desired, but it is also desired to keep the amount of gold per unit area of the surface layer as small as possible on cost grounds. Processes have long since been developed, therefore, for producing thin surface layers of gold or gold-containing material on such articles. Because the surface layers are thin, however, there is risk of the surface layers prematurely wearing away from the articles, especially at their projecting parts. Depending upon the types of demands placed on the article, mechanical and/or chemical wear can cause this, for example by rubbing or perspiration.

It is known from German patent publication OS No. 2,825,513 to provide an underlayer of titanium nitride (TiN) beneath a gold or gold-containing surface layer which, because of its general gold color, tends to disguise any wearing away of the surface layer. It is also known from the same publication that the gold color of the underlayer and the surface layer can be influenced for adaptation to one another by admixing or alloying other materials with one or both layers.

It has been shown, however, that titanium nitride cannot itself produce a realistic gold color as is apparent, also, from the diagram of the referenced publication. It has been shown, further, that titanium nitride, even with admixture of further metals for a realistic gold color, does not have the "brilliance" of gold, but is more matte. Matte surfaces generally look darker so that any parts of such an underlayer that show through the surface layer appear darker on account of lacking brilliance even though the underlayer has the same color as the surface layer.

For example, by measurements with a color measuring apparatus of the MacBeth 1500 type using a light source of type C, the so-called CIELAB units of color and brilliance of materials can be determined. Details of this measuring process are given later. An $L^*$ value in CIELAB units characterizes the brilliance. The $L^*$ value for different gold alloys lies above 85 and represents a high brilliance. The known underlayer of TiN, however, has a $L^*$ value of only 73. This represents a much-reduced brilliance as compared to gold alloys, noting that a very matte material does not have a zero $L^*$ value, but one between about 40 and 50.

Experiments have been carried out to increase the brilliance ($L^*$ value) of titanium nitride by altering the stoichiometry of the compound. Thus, for example, the compound $TiN_x$, wherein x is less than 1, gives a brighter gold color as compared to stoichiometric titanium nitride, TiN. The increase in the $L^*$ (brilliance) value is, however, relatively trivial, to 77, and is accompanied by the disadvantage that the gold color of the $TiN_x$ exhibits a green tint. The green tint is undesirable for color compatibility with gold-colored surface layers having a red color component because, after the surface layer erodes, there is an obvious difference in the color of the underlying layer.

Hardness or durability is also required for a wear-disguising underlayer like that described in the referenced publication so that, when the surface layer has worn away to expose the underlayer, the underlayer itself does not wear away too quickly and, thereby, destroy its wear-disguising function.

SUMMARY OF THE INVENTION

It is an object of the invention, therefore, to provide a hard, gold-colored underlayer having comparable brilliance as well as clor to a gold or gold-containing surface layer thereon, an article therewith, and a process for its production.

This and other objects are achieved according to the invention by an underlayer comprising at least one material selected from the group consisting of a carbonitride of titanium, zirconium, hafnium or vanadium and hafnium nitride for association with a gold or gold-containing surface layer, at least in intended use.

The above-named materials have sufficient hardness for outstanding mechanical and chemical durability against all the types of attack experienced by decorative articles. They also have, however, a markedly increased brilliance as compared to titanium nitride, which makes evidence of wear of a gold or gold-containing surface layer on the articles much less obvious than with the known titanium-nitride underlayer.

All the materials in the group of the invention have an $L^*$ value of 80 or more. As a result, there is no marked loss of brilliance in the appearance of abraded places on a gold or gold-containing surface layer thereon and, assuming color compatibility, dark patches are, therefore, not apparent.

All of the materials in the group of the invention have a general gold color, and it is possible, therefore, at least by suitable selection among the materials of the group, at least two approximate the gold color of a gold or gold-containing surface layer thereon.

It may be desired, however, to include in the underlayer with the materials of the above, first group of the invention at least one element selected from the second group consisting of Al, Cr, Fe, Co, Ni, Cu, Zn, Nb, Mo, Rh, Pd, Ag, In, Sn, W, Ir, and Pt for achieving a better color match to the surface layer. The materials of the second group may also increase the hardness or durability of the underlayer in use or adhesion to the surface layer or an article on which the underlayer is used. The use, selection, and proportions of the second group of materials for color matching, hardness, and adhesion will be apparent to a metallurgist in dependence on the surface layer and article, at least within reasonable experimentation among the limited groups guided by ordinary knowledge in the field. In this regard, too, the gold or gold-containing surface layer may contain at least one element selected from the third group consisting of Al, Pd, Zn, Sn, Ag, Co, Ni, Cu, Ti, Ga, and Cd and the article to receive the underlayer may be of a material selected from the fourth group consisting of steel, brass, monel, German silver, aluminum, $Al_2O_3$, and zinc and may be die cast therefrom, for example.

For color matching, varying the relative carbon and nitrogen components or stoichiometry of the carbonitrates of the first group of materials of the invention for the underlayer or influencing the coating growth thereof by different conditions broaden still further the palette of colors obtainable. These techniques, too, are determined by simple trials well within the ordinary skill of those in the art.

Electroplating does not effectively deposit the compound materials of the first group of the invention for the underlayer. These can be deposited with no problem by a physical deposition (PVD) process, however, such as, particularly advantageously, a cathode vaporization process because, by this process, it is possible to vaporize a metal, cathode target for deposition directly, without melting it. Other PVD processes may also be used but may not be as effective. For example, the high melting points of the first group of materials, which lie between 2000° and 3000° C., cause only a columnar growth of underlayer coating to be produced according to the method described by Thornton in *J. Vac. Sci. Technol.*, vol. 11, p 666, 1974 at the temperatures of up to 300° C. at which substrates are usually coated thereby. This has very poor mechanical properties and corrosion resistance as a result. A thick underlayer coating can be produced, however, by ion bombardment of an article, as in cathode vaporization.

Particularly favorable coating conditions are achieved by a cathode vaporization process using two double-arranged high-performance (magnetron) cathodes as described in German patent publication OS No. 31 07 914 and U.S. Pat. No. 4,426,267. This makes it possible to apply the underlayer securely to the article from the target of one double cathode and the surface layer of gold or gold-containing material securely to the underlayer from the other, the latter not being directly possible by the more-usual electroplating process because the materials of the underlayer cannot be activated directly for such bonding deposition of the surface layer.

It is particularly advantageous if the gold-colored underlayer has a thickness of from about 0.2 to about 0.3 micron and the gold or gold-containing surface layer has a thickness of from about 0.05 to about 1.0 micron.

The underlayer of the present invention can be made by vaporising metallic, cathode target of at least one of Ti, Zr, Hf, and V in a known cathode vaporization device in a reactive atmosphere of an inert gas, $N_2$ and a hydrocarbon which is gaseous at room temperature. A reaction product of the metal and at least one component of the gases at least one of the first-mentioned group forms the underlayer of the invention which is deposited onto an article in the device and then so depositing a surface layer is deposited thereover from a metallic, cathode target of gold or gold-containing material in one of a neutral or reactive atmosphere.

BRIEF DESCRIPTION OF THE DRAWINGS

Preferred embodiments and examples which illustrate but do not limit the invention will now be described with reference to drawings in which:

FIG. 5 is a nomograph of the spectral dependence of the reflection values for zirconium nitride;

FIG. 6 is a nomograph of the spectral dependence of the reflection values for hafnium nitride.

DESCRIPTION OF THE PREFERRED EMBODIMENTS AND EXAMPLES

Figure 1:
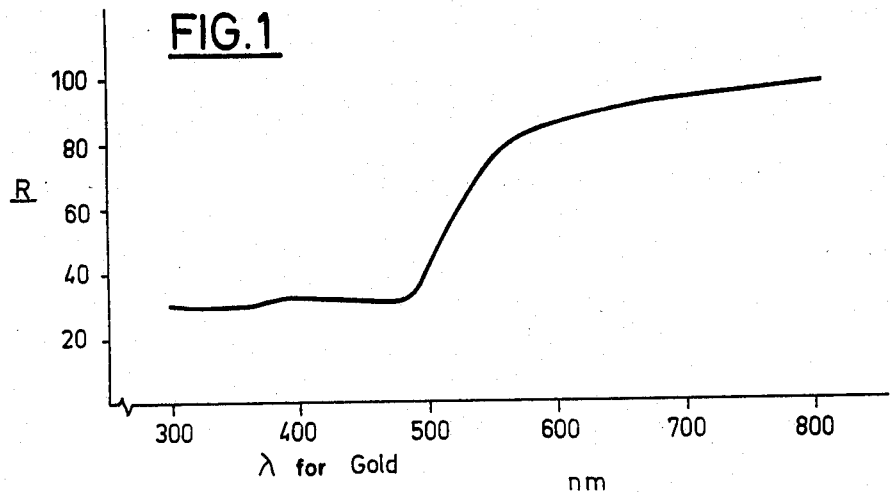
FIG. 1 is a nomograph of the spectral dependence of the reflection value of pure gold.
Figure 2:
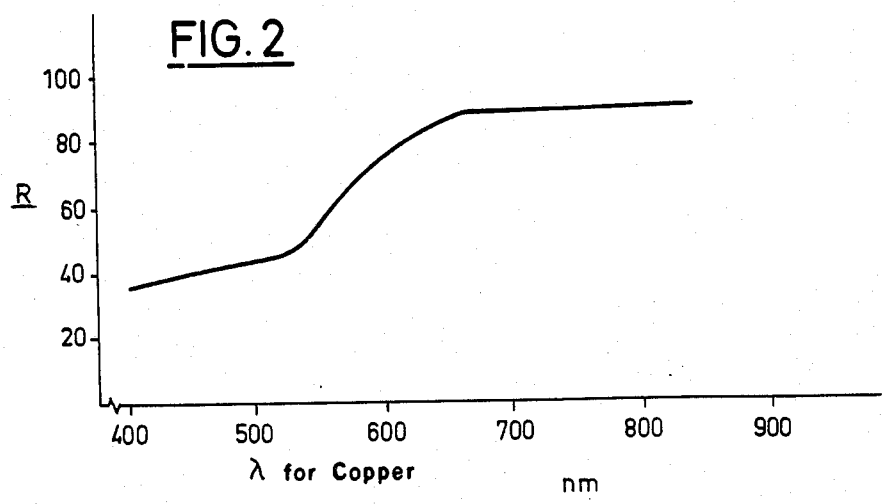
FIG. 2 is a nomograph of the spectral dependence of the reflection value of pure copper.
Figure 3:
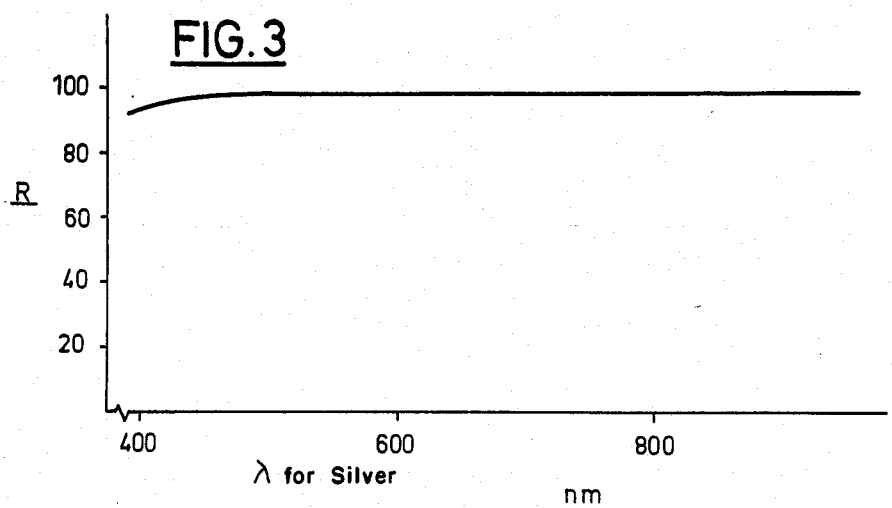
FIG. 3 is a nomograph of the spectral dependence of the reflection value for pure silver.

From FIGS. 1 to 3, those in the art will see that a high brilliance is, as a rule, to be expected from a gold alloy which contains copper and silver. Thus, for example, an 18 carat gold alloy with a 9% silver content and the remainder copper can be expected to have a high brilliance, which it does, as shown by the L* of 86 in the concluding Table.

Figure 4:
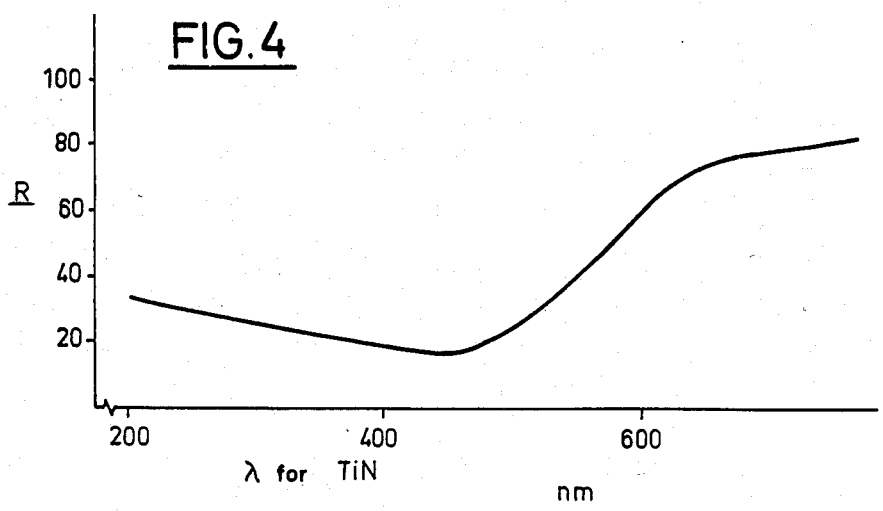
FIG. 4 is a nomograph of the spectral dependence of the reflection value for titanium nitride.

From a comparison of FIGS. 1 and 4 and the corresponding entries in the Table, those in the art will see that titanium nitride (FIG. 4) has a substantially lower brilliance in the visible region of the spectrum than the gold of FIG. 1 and the L* value in the Table corresponds.

From FIGS. 5 and 6, which show that the spectral reflection relationships of zirconium nitride (ZrN) and hafnium nitride (HfN) first increase sharply from a wavelength of about 400 nm and then approach a limiting value asymptotically at a wavelength to about 500 nm, as compared to FIG. 4, which shows a relatively slow increase of the spectral reflection relationship of titanium nitride (TiN) from a wavelength of about 450 nm and then an asymptotic approach to a limiting value above a wavelength of about 650 nm.

The CIELAB units set out in the Table were determined by a measuring method specified some time ago by many manufacturers of surface coatings and, especially, decorative coatings. It is a colorimetric measuring method in which a measuring light beam from a standard light source with quite specific spectral properties is directed at the object to be measured and the reflected part of the measuring light beam evaluated in the visible wavelength region of the spectrum for the degree of brilliance and the color proportions of red and yellow, for example, which determine a gold color. The method is described, for example, by R. M. German, M. M. Guzarsky and D. C. Wright in *Journal of Metals*, March 1980, pages 113 ff. Manufacturers of instruments for color measurements are identified in the *Handbook of Optics* by Walter G. Driscol and W. Vaughan, Mac-Graw-Hill Book Company, Edition 1978, Chapter 9, but instruments specially for CIELAB units are supplied by the following companies:

| | |
|---|---|
| MacBeth | (Newburgh, N.Y./USA) |
| Hunterlab | (Reston, Virginia/USA) |
| Instrument Colour Systems | (Newbury, Berkshire/GB) |
| Diano Corp. | (USA - TypMatch Scan DTM 1045) |

Having thus demonstrated the efficacy and availability of CIELAB brilliance and color test, it can be seen from the Table that the indicated materials from the first group of the invention for the underlayer (titanium carbonitride and hafnium nitride) have a brilliance closer to gold or gold-containing materials for the surface layer than TiN and a general gold color, i.e. relatively high yellow and low red, about as good. In the latter, color regard, reference is made to the about-half gold materials at the foot of the Table, which also correspond to the following examples, for the potential for matching surface and underlayer color as well as brilliance by, in this case, admixture to the gold for the surface layer.

Figure 7:
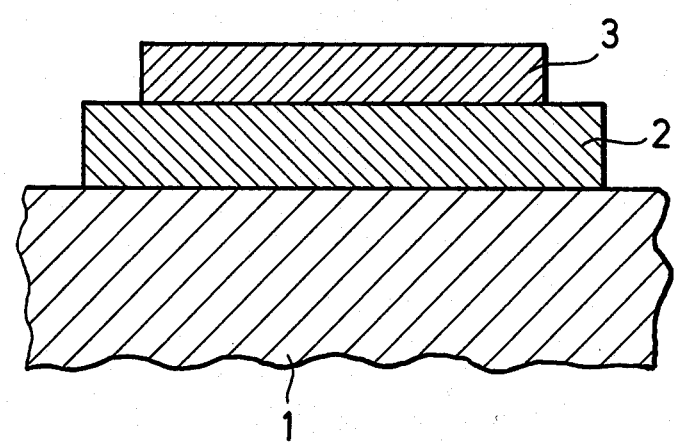
FIG. 7 is a sectional elevation of a layered structure according to the invention.

FIG. 7 shows a surface or substrate 1 of an article having an underlayer 2 thereon of at least one of the hard, gold-colored materials according to the first group of the invention and, on this, a surface layer 3 of gold or gold-containing material. A bonding layer (not shown) of the pure metal of the hard material of the first group between the substrate article portion 1 and the underlayer 2 may be used in another embodiment.

The structure of FIG. 7 may be made by the following, preferred processes:

EXAMPLE 1

A cleaned watch case of stainless steel is placed in a cathode vaporization device with two double-arranged, high-power cathodes according to previously-referenced, German patent publication OS No. 31 07 914. The targets of each pair of cathodes are oppositely arranged so that, by placing the watch case in the middle between the cathodes, it is equally coated from both targets.

One of the double cathode arrangements is loaded with targets of zirconium, the other has targets of a 14 carat gold alloy with 30% silver, remainder copper.

The watch case is first positioned in the middle between two, erosive-treatment screens and the cathode vaporization device is then evacuated to $3 \times 10^{-5}$ mbar. For the erosive treatment a negative d.c. potential of about 1800 volts is applied to the screens and argon is admitted into the device up to a total pressure of about $1.8 \times 10^{-3}$ mbar. An argon arc is struck through a brief impulse, and a substrate current of about 50 mA instituted by controlling the d.c. potential. The erosive treatment is maintained for long enough to render the surface of the watch case metallically clean.

For cleaning its targets, a grid is placed between the double arrangement of zirconium cathodes. The argon pressure is reduced to about $8 \times 10^{-3}$ mbar and the substrate potential reduced to the value OV. The current of the cathodes is regulated to give a mean current density of 10 Wcm$^{-2}$. Once stable conditions have been established at the cathodes, the screens are removed and the watch case put at a substrate potential of $-150$ V and positioned between the zirconium cathodes. A metallic binding layer of zirconium about 0.05 $\mu$m thick is then deposited on the substrate.

Subsequently, measured flows of nitrogen (N$_2$) and acetylene (C$_2$H$_2$) are introduced into the device through gas inlets as reactive gases as follows: the nitrogen flow is measured so that, without introduction of argon into the device, there is a nitrogen pressure of about $2 \times 10^{-3}$ mbar and the acetylene flow is measured so that, without introduction of argon nitrogen into the device, there is an acetylene pressure of about $4 \times 10^{-4}$ mbar. By feeding nitrogen and acetylene into the device, the cathode plasma discharge therein is so affected as to form zironium carbonitride on the binding layer on the surface of the watch case by the plasma reaction of the zirconium with the reactive gases.

The negative potential on the watch case which is maintained during this deposition sets up a current density of 4 mA/m$^2$ on the watch-case substrate. As a result, a dense layer deposition of the zirconium carbonitride is achieved for good corrosion protection of the substrate. The zirconium carbonitride layer is so deposited to a thickness of about 0.7 $\mu$m.

The zirconium carbonitride deposition is then stopped and a screen is introduced between the double cathode arrangement loaded with the targets of the gold alloy. More argon is now introduced into the equipment up to a total pressure of about $8 \times 10^{-3}$ mbar. Then an externally-controlled negative d.c. potential is applied to the targets such that their mean current density is 3 Wcm$^{-2}$. The cathodes are cleaned by a vaporisation process against the screen. Then the watch case is set at a substate potential of about 0 V and positioned between the god-alloy cathodes.

The coating plasma is then produced with the gold-alloy cathodes for a duration such that a gold-alloy layer about 0.4 $\mu$m thick is deposited on the watch case. Objectively, subsequent measurement of its CIELAB values gives the values shown in the Table. Comparison with the CIELAB values for the zirconium carbonitride layer would be expected to show a good match in gold color and brilliance. Subjectively, this was confirmed by an abrasive wear test in which the gold-alloy area was worn away to the zirconium carbonitride layer in areas but no deterioration of brilliance could be detected.

EXAMPLE 2

A cleaned watch case of brass from which tarnish film and other surface deposits have been removed by known, special brass-cleaning techniques is put into a cathode vaporisation device comparable to that of Example 1, but equipped with three cathode pairs. The target materials of the three cathode pairs are:

| | |
|---|---|
| Cathode pair 1: | NiCr (50/50) |
| Cathode pair 2: | Titanium |
| Cathode pair 3: | Gold alloy of 50% Au, 42% Cu, 3% Ni and 5% Al. |

(Note: all percentages in each Example are by weight.)

The cathode vaporization device is evacuated to a pressure of about $3 \times 10^{-5}$ mbar, and the watch case subjected to erosive (etching) treatment as in Example 1. For this, there is a screen between the first cathode pair.

After conclusion of the etching process, the argon pressure in the device is reduced to $8 \times 10^{-3}$ mbar, and the NiCr targets are cleaned by vaporization against a zero potential screen. A watch-case substrate potential of about $-1500$ V is then established and the watch case positioned between the NiCr cathodes. A vaporization process is then carried out with a mean current density of 10 Wcm$^{-2}$ at the targets until a nickel/chrome layer about 1.5 $\mu$m thick is produced. Then the screens are inserted between the titanium cathodes, the substrate potential set to zero, and the titanium cathodes cleaned by evaporation against the screens.

Subsequently, a watch-case substrate potential of about $-160$ V is established and the watch case introduced between the titanium cathodes. A vaporization process is then carried out with a mean current density of 10 Wcm$^{-2}$ at the cathodes until a metallic titanium layer about 0.05 $\mu$m thick has been deposited.

For then depositing TiC$_x$N$_y$ (with x and smaller than 1), calibrations for fixed flows of C$_2$H$_2$ and N$_2$ gases into the device have been determined. These are such that pressures of about $2.0 \times 10^{-4}$ mbar for the C$_2$H$_2$ and about $1.3 \times 10^{-3}$ mbar for the N$_2$ are set up, without the supply of argon. The watch case, coated with NiCr and Ti as described, is then coated by further deposition from the titanium cathodes, this time with admission of the flows of the N$_2$ and C$_2$H$_2$ and argon up to a pressure of about 8×10$^{-3}$mbar into the device for such a time that a layer of titanium carbonitride about 0.8 μm is produced.

Finally, the flows of C$_2$H$_2$ and N$_2$ are adjusted (e.g. shut off) and the watch-case substrate set at zero potential. A screen is introduced between the gold-alloy targets, and these targets cleaned at a mean current density of 3 Wcm$^{31\ 2}$. Then the screen is taken away and the watch case arranged between the gold-alloy targets for a coating process carried out until a gold-alloy coating about 0.5 μm thick has been deposited.

The CIELAB units for this gold-alloy coating are given in the Table. Comparison with the CIELAB values for titanium carbonitride also given in the Table show approximate correspondence, i.e., with respect to the a* and b* color values, very good correspondence and, with respect to the L* brilliance values, good correspondence.

EXAMPLE 3

In the already-described cathode vaporization device of Example 1, the first cathode pair is fitted with targets of hafnium and the second cathode pair, with targets of a gold alloy of 58.5% Au, 34% Cu, remainder Ag. A stainless steel watch case is used as a substrate. The various, preliminary cleaning and pumping operations are carried out as in Example 1.

Then a screen is introduced between the hafnium targets and about 0 V used as substrate and screen potentials. Argon is introduced, up to a pressure of about 5×10$^{-3}$mbar, and the hafnium targets cleaned by vaporization at a mean current density of 10 Wcm$^{-2}$. The substrate is then positioned between the hafnium cathodes at a substrate potential of about −170 V and coated with a mean current density of 10 Wcm$^{-2}$ until a coating of metallic hafnium about 0.1 μm thick has been produced.

After this, a nitrogen flow corresponding to a predetermined, argonless calibration pressure of about 2.5×10$^{-3}$mbar is introduced. The hafnium coating process is then carried on to a hafnium nitride layer thickness of about 0.8 μm.

Finally, the substrate and the screens are returned to zero potential and the screens inserted between the gold-alloy cathodes. The nitrogen input is stopped and the gold-alloy targets vaporised with a mean current density of 2 Wcm$^{-2}$. A gold-alloy coating is then carried out to a layer thickness of about 0.2 μm.

CIELAB values of gold-alloy coating were determined, as in the Table. Comparison with the hafnium nitride CIELAB values also found in the Table shows a good to very good a*, b*, color agreement, and quite good L*, brilliance agreement.

It will be understood that the specification and examples are illustrative but not limitative of the present invention and that other embodiments within the spirit and scope of the invention will suggest themselves to those skilled in the art.

TABLE

| Material | CIELAB -units | | |
|---|---|---|---|
| | L* Brilliance | a* Red Value | b* Yellow Value |
| 24-K-Gold (see FIG. 1) | 89.3 | 3.2 | 40.0 |
| Copper (see FIG. 2) | 85.6 | 11.2 | 20.3 |
| Silver (see FIG. 3) | 99.2 | 0.3 | 1.0 |
| 18-K-Gold (9% Ag, rest Cu) | 86. | 5.5 | 22.0 |
| TiN (comparative) (see FIG. 4) | 73. | 3.6 | 36.0 |
| Ti$n_y$ (x less than 1) (comparative) | 77. | −0.4 | 17.0 |
| Titanium Carbonitride | 80. | 0.2 | 14.0 |
| Zirconium Nitride (see FIG. 5) | 87. | −4.0 | 25.8 |
| Hafnium Nitride (see FIG. 6) | 80.0 | −4.7 | 30.9 |
| Examples | | | |
| 1. 58.5% Au, 30% Ag rest Cu | 90.7 | −2.2 | 23.0 |
| 2. 50% Au, 42% Cu 3% Ni, 5% Al | 88.0 | 0.1 | 15.5 |
| 3. 58.5% Au, 39% Ag rest Cu | 91.9 | −3.8 | 21.8 |

What we claim is:

1. A structure comprising:
a gold or gold-containing surface layer; and
underlayer means for approximating the brilliance and color of the surface layer, whereby to disguise therewith worn away portions of the surface layer, the underlayer means comprising a gold-colored underlayer on the surface layer comprising at least one material selected from the group consisting of a carbonitride of titanium, zirconium, hafnium and vanadium.

2. The structure of claim 1, wherein the surface layer is gold containing and additionally comprises at least one element selected from the group consisting of Al, Pd, Zn, Sn, Ag, Co, Ni, Cu, Ti, Ga, and Cd.

3. The structure of claim 1, wherein the surface layer is from about 0.05 micron to about 1 micron thick.

4. The structure of claim 3, wherein the surface layer is gold containing and additionally comprises at least one element selected from the group consisting of Al, Pd, Zn, Sn, Ag, Co, Ni, Cu, Ti, Ga, and Cd.

5. The structure of claim 3, wherein the underlayer is from about 0.2 micron to about 0.3 micron thick.

6. The structure of claim 5, wherein the underlayer additionally comprises at least one element selected from the group consisting of Al, Cr, Fe, Co, Ni, Cu, Zn, Nb, Mo, Rh, Pd, Ag, In, Sn, W, Ir, and Pt.

7. The structure of claim 6, wherein the surface layer is gold containing and additionally comprises at least one element selected from the group consisting of Al, Pd, Zn, Sn, Ag, Co, Ni, Cu, Ti, Ga, and Cd.

8. The structure of claim 1, wherein the underlayer is from about 0.2 micron to about 0.3 micron thick.

9. The structure of claim 8, wherein the underlayer additionally comprises at least one element selected from the group consisting of Al, Cr, Fe, Co, Ni, Cu, Zn, Nb, Mo, Rh, Pd, ag, In, Sn, W, Ir, and Pt.

10. The structure of claim 1, wherein the underlayer additionally comprises at least one element selected from the group consisting of Al, Cr, Fe, Co, Ni, Cu, Zn, Nb, Mo, Rh, Pd, Ag, In, Sn, W, Ir, and Pt.

11. The structure of claim 10, wherein the surface layer is gold containing and additionally comprises at least one element selected from the group consisting of Al, Pd, Zn, Sn, Ag, Co, Ni, Cu, Ti, Ga, and Cd.

12. A structure, comprising, in combination:
a gold or gold-containing surface layer; and
an underlayer on the surface layer comprising at least one material selected from the group consisting of a carbonitride of titanium, zirconium, hafnium and vanadium.

13. The structure of claim 12, wherein the surface layer is gold containing and additionally comprises at least one element selected from the group consistig of Al, Pd, Zn, Sn, Ag, Co, Ni, Cu, Ti, Ga, and Cd.

14. The structure of claim 12, wherein the underlayer additionally comprises at least one element selected from the group consisting of Al, Cr, Fe, Co, Ni, Cu, Zn, Nb, Mo, Rh, Pd, Ag, In, Sn, W, Ir, and Pt.

15. The structure of claim 14, wherein the surface layer is gold containing and additionally comprises at least one element selected from the group consisting of Al, Pd, Zn, Sn, Ag, Co, Ni, Cu, Ti, Ga, and Cd.

* * * * *

UNITED STATES PATENT AND TRADEMARK OFFICE
CERTIFICATE OF CORRECTION

PATENT NO. : 4,791,017
DATED : December 13, 1988
INVENTOR(S) : Dieter Hofmann, et al.

It is certified that error appears in the above-identified patent and that said Letters Patent is hereby corrected as shown below:

Col. 1, line 2 "and" should be -- and an --.

Col. 2, line 15 "clor" should be --color--;

Col. 2, line 41 "two" should be --to--;

Col. 3, line 43 Insert --a-- after "vaporising";

Col. 3, lines 50 and 51 delete "so depositing";

Col. 7, line 11 "3 Wcm$^{31\ 2}$" should be -- 3Wcm$^{-2}$ --.

Col. 8, line 68 (new claim 9) "ag" should be --Ag--.

Signed and Sealed this

Eighteenth Day of July, 1989

Attest:

DONALD J. QUIGG

Attesting Officer

Commissioner of Patents and Trademarks